United States Patent [19]
DeChiaro et al.

[11] Patent Number: 5,923,160
[45] Date of Patent: Jul. 13, 1999

[54] ELECTROSTATIC DISCHARGE EVENT LOCATORS

[75] Inventors: Louis F. DeChiaro, Ocean County; Min-Chung Jon, Mercer County; Don L. Lin, Somerset County, all of N.J.

[73] Assignee: Lucent Technologies, Inc., Murray Hill, N.J.

[21] Appl. No.: 08/845,122

[22] Filed: Apr. 19, 1997

[51] Int. Cl.⁶ .................................................. G01R 31/02
[52] U.S. Cl. ......................................... 324/72.5; 324/457
[58] Field of Search ........................... 324/72, 72.5, 452, 324/456, 457; 361/112, 113, 91

[56] References Cited

U.S. PATENT DOCUMENTS

| H536 | 10/1988 | Strickland | 324/456 |
| 3,787,707 | 1/1974 | Gregg | 361/112 |
| 4,631,473 | 12/1986 | Honda | 342/72.5 |
| 5,598,099 | 1/1997 | Castleman | 324/456 |

FOREIGN PATENT DOCUMENTS 2166872  5/1986  United Kingdom ................... 324/456

OTHER PUBLICATIONS

"The GPS Equations and the Problems of Apollonius," J. Hoshen, IEEE Trans. on Aerospace & Elec. Sys., vol. 32, No. 3, Jul. 1996, pp. 1116–1124.

Primary Examiner—Maura Regan
Attorney, Agent, or Firm—Stephen R. Bartholomew

[57] ABSTRACT

Determining the location of an ESD event is achieved through the use of an envelope detector or absolute value comparator which identifies the arrival of an electromagnetic waveform generated by an ESD event at each of a plurality of antennas. Arrival times are compared to determine the location of the ESD event. A plurality of N antennas are employed, and each antenna is coupled to a corresponding envelope detector, threshold discriminator, switch, and register. The output of a clock is coupled to the switches, and a microprocessor is coupled to the registers. When an antenna receives a waveform corresponding to ESD, the envelope detector extracts an envelope signal related to the envelope of the waveform and couples the envelope signal to the threshold discriminator. When the envelope signal has a value above a specified threshold, the threshold discriminator sends a signal to latch the current count of the clock into the corresponding register. When each register is loaded with an arrival time, the microprocessor applies a triangulation procedure to the arrival times to calculate the location of the ESD event.

8 Claims, 5 Drawing Sheets

ELECTROSTATIC DISCHARGE EVENT LOCATORS

BACKGROUND OF THE INVENTION

1. Field of the Invention

The invention relates generally to electronic testing systems, and more specifically to techniques for characterizing electrostatic discharge events.

2. Background Art

Some electrostatic discharge (ESD) events are of such a low level as to be virtually imperceptible to human beings, even though these discharges may damage electronic devices. Such damage is problematic in the operational environment of electronic circuit board assembly lines. For example, an ESD event may occur on an integrated circuit board that is in the process of being assembled, or it may occur as a metal chair leg contacts a metal file cabinet. If ESD events are occurring on integrated circuit boards, manufacturing engineers may need to stop production to conduct an ESD investigation. But if all of the ESD events in an electronic circuit board assembly area are occurring from metal chair legs, no further action is required.

Existing ESD detectors are equipped to detect the existence, but not the location, of ESD events. One illustrative ESD detector, described in U.S. Pat. No. 4,631,473, discloses the use of an antenna connected to a circuit that generates an indication when an ESD event takes place. Although this device provides information about the actual occurrence of an ESD event, no information is provided about the location of the ESD event.

SUMMARY OF THE INVENTION

Determnining the location of an ESD event is achieved in an analog ESD event locator through the use of an envelope detector which identifies the arrival of an electromagnetic waveform generated by an ESD event at each of a plurality of antennas. Determining the location of an ESD event is achieved in a digital ESD event locator through the use of a combinatorial logic network which identifies the arrival of an electromagnetic waveform generated by an ESD event at each of a plurality of antennas. For both the digital and analog ESD event locators, arrival times among the plurality of antennas are compared to determine the location of the ESD event. One illustrative embodiment for the analog ESD event detector includes a plurality of N antennas, and each antenna is coupled to a corresponding envelope detector, threshold discriminator, switch, and register. The output of a clock is coupled to the switches, and a microprocessor is coupled to the registers. When an antenna receives a waveform corresponding to an ESD event, the envelope detector extracts an envelope signal related to the envelope of the waveform and couples the envelope signal to the threshold discriminator. When the envelope signal has a value above a specified threshold, the threshold discriminator sends a signal to latch the current count of the clock into the corresponding register. This current count represents the relative arrival time of the waveform at the corresponding antenna. When each register is loaded with an arrival time, the microprocessor applies a triangulation procedure to the arrival times to calculate the location of the ESD event.

DETAILED DESCRIPTION OF THE INVENTION

Figure 1:
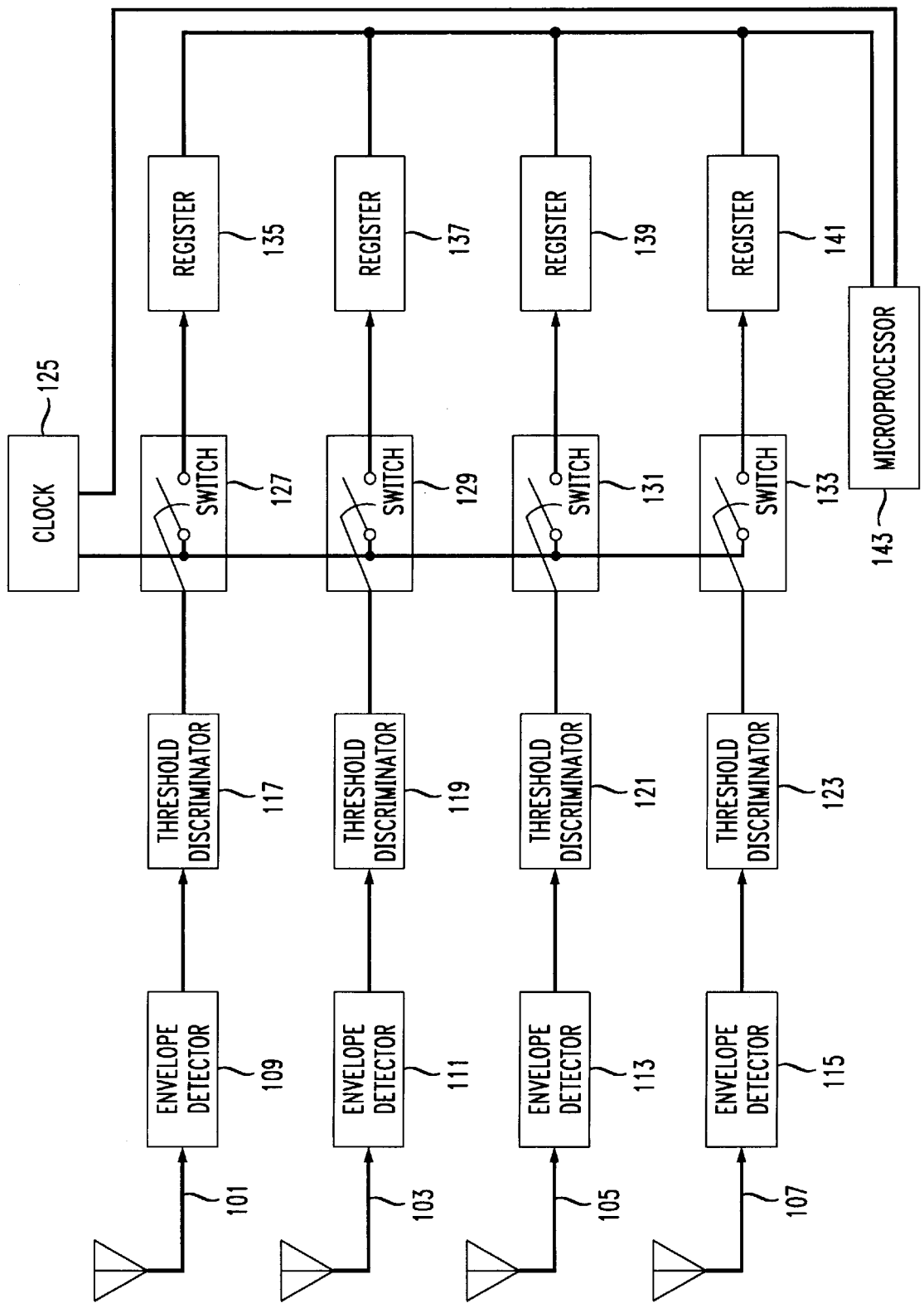
FIG. 1 is a hardware block diagram of an ESD event locator constructed according to an analog embodiment disclosed herein.

Novel systems and methods are disclosed for characterizing the location of an ESD event. Refer to FIG. 1, which is a hardware block diagram of an ESD event locator constructed according to an analog embodiment disclosed herein. A plurality of N antennas 101, 103, 105, 107 are employed. Four antennas are shown for illustrative purposes, it being understood that any convenient number of antennas may be employed, so long as at least two antennas are used. In the case where only two antennas are used, there is not a unique solution for the location of an ESD event, because the use of two antennas will only determine the ESD source to be one of an infinite number of points lying on a hyperboloid of revolution whose axis of symmetry contains the line segment joining the two antennas.

For most system applications, three or more antennas are used, thereby permitting the location of the ESD event to be substantially uniquely determined. In general, as the number of antennas increases beyond three, the location of an ESD event may be determined with greater precision, and/or the overall coverage area of the ESD event location determination system is increased. Irrespective of the number of antennas that are used, the antennas are positioned at known locations relative to the work area. In this manner, the antennas may be conceptualized as being placed in an array. The antennas may be positioned at various locations within, or near, the work area. Moreover, the antenna array could, but need not, be mounted on a portable structure that maintains the spatial relations between the antennas, such that the portable structure can be moved and transported to various factories and/or assembly lines.

Although virtually any convenient design may be employed to implement antennas 101, 103, 105, and 107, in many cases, a convenient design consists of a short whip antenna several inches long mounted on an optional ground plane or used with optional radials. For some system applications, especially where the distance between the antennas 101, 103, 105, and 107 and the remainder of the ESD event locating system is relatively great, one or more antennas could be incorporated into one or more optional antenna assemblies. The antenna assemblies could include envelope detector and/or threshold discriminator circuitry situated in relatively close proximity to the antenna. The assemblies may also include optional receivers and/or demodulators for converting signals to a lower frequency range, for demodulating received signals, and/or for converting received signals down to baseband, as long as information on signal arrival times is accurately preserved.

Pursuant to the embodiment shown in FIG. 1, hereinafter referred to as the analog embodiment, each antenna 101, 103, 105, 107 is coupled to a corresponding envelope detector 109, 111, 113, 115, respectively. If desired, an optional broadband RF amplifier may be employed between each antenna and its corresponding envelope detector. An illustrative RF amplifier for this purpose would have a relatively wide bandwidth of, for example, 1 GHz, and be designed to amplify relatively low-level RF signals.

Envelope detectors 109, 111, 113, 115 may be implemented by virtually any type of circuitry that, in response to an input waveform, generates an output waveform related to the envelope of the input waveform. One example of an envelope detector is a series detector diode followed by a shunt RC (resistance-capacitance) circuit. The diode is in series with the envelope detector input, and the RC circuit is in shunt across the envelope detector output.

The time constant of the RC circuit of the envelope detector is selected to be sufficiently slow so that relatively fast random impulse noises are filtered out by the shunt RC element. However, the time constant must be sufficiently fast so that an envelope waveform is generated in response to received waveforms generated by ESD events. Illustrative values of R and C could, for example, be around 500 ohms for R and 20 pF for C, although other values could also be employed for R and/or C. Moreover, an LC circuit could be used in place of the RC circuit, or an equivalent series RL circuit could be used in place of the shunt RC circuit. The diode may be a Schottky-barrier diode, a hot-carrier diode, a microwave diode, or virtually any other type of diode that is adapted to detect relatively low-level, high frequency signals on the order of 1 Ghz.

According to an alternate embodiment of FIG. 1, termed the "A-to-D converter embodiment", the envelope detectors are replaced with analog-to-digital converters. Each antenna may be coupled to its own corresponding analog-to-digital converter or, alternatively, a single analog-to-digital converter may be rapidly switched among the antennas, wherein each antenna is assigned a unique time slot with respect to the single analog-to-digital converter. If antennas 101, 103, 105, 107 include optional receiver circuitry as discussed above, then this receiver circuitry may optionally include these analog-to-digital converter(s). As a general matter, these analog-to-digital converters generate a digital value that is related to the instantaneous value of the analog input signal. In the digital embodiment, the analog-to-digital converter(s) are preferably relatively high-speed converters, on the order of 5 gigabytes per second or better. Optional broadband RF amplifiers may be employed between respective antennas and the corresponding analog-to-digital converter(s).

Returning now to the analog embodiment shown in FIG. 1, each envelope detector 109, 111, 113, 115 is coupled to a corresponding threshold discriminator 117, 119, 121, 123, respectively. Each threshold discriminator 117, 119, 121, 123 is triggered by a digital value representing a signal voltage greater than or equal to a specified threshold, greater than a specified threshold, less than a specified threshold, or less than or equal to a specified threshold. Other alternatives include triggering the threshold discriminator if the absolute value of the signal voltage is greater than a specified threshold, or greater than or equal to a specified threshold. Depending upon the specific type of threshold selected, digital values corresponding, for example, to signal voltages less than a specified threshold will not trigger the threshold discriminator. As a general matter, the threshold discriminator is designed to be triggered by an ESD event that is of sufficient magnitude that it might cause damage to an electronic component. The threshold discriminator should ideally ignore noise and other signals that are not produced by ESD events.

Each threshold discriminator 117, 119, 121, 123 is coupled to a trigger terminal of a corresponding switch 127, 129, 131, 133, respectively. Although mechanical switches could be employed for switches 127, 129, 131, 133, it is expected that electronic switches would be used for most system applications. Such electronic switches would functionally include two contacts that are normally open, with the trigger terminal providing a momentary closed circuit when the trigger terminal is activated. Alternatively, activation of the trigger terminal could cause the switch contacts to latch into a closed position. Ideally, the switches 127, 129, 131, 133 exhibit a relatively fast response time with respect to the period of clock 125, such that the time between activation of the switch trigger terminal and the actual closure of the switch contacts is but a fraction of a clock 125 period.

Each switch 127, 129, 131, 133 includes a first contact that is coupled to a clock 125. A second contact of each switch 127, 129, 131, 133 is coupled to a corresponding register 135, 137, 139, 141, respectively. Clock 125 produces a digital count value that is a function of time. This count value may be produced in response to the generation of a periodic waveform. In order to properly determine the locations of ESD events in a typical industrial environment, this periodic waveform should have a period at least in the nanosecond range, if not faster.

Registers 135, 137, 139, 141 are each equipped to store a digital count value generated by the clock 125. Conventional memory registers may be employed for registers 135, 137, 139, 141 such as, for example, random-access memory (RAM) chips, provided that their response time is sufficiently fast. Each register 135, 137, 139, 141 is addressable and readable by a microprocessor 143. Microprocessor 143 may be virtually any type of processing device known to those skilled in the art microprocessor. Microprocessor 143 is programmed to perform calculations on the digital count values stored in registers 135, 137, 139, 141 so as to determine the location of an ESD event.

Although the configuration of FIG. 1 shows the use of four antennas 101, 103, 105, 107, this is for purposes of illustration, as any number of antennas greater than one may be employed. For example, an ESD event locating system could employ three antennas or five antennas. Irrespective of the number of antennas to be used, each antenna is associated with a corresponding envelope detector, threshold discriminator, switch, and register. Alternatively, in a digital embodiment, a summation circuit can sum up the train of pulses from all the antennas, and one analog-to-digital converter can perform the digitization for all waveforms. Although the diagram of FIG. 1 shows envelope detectors 109, 111, 113, 115, threshold discriminators 117, 119, 121, 123, switches 127, 129, 131, 133 and registers 135, 137, 139, 141 all as separate blocks, this is for illustrative purposes. For example, all of the envelope detectors 109, 111, 113, 115 could be combined into one integrated circuit. Alternatively, the envelope detector 109, threshold discriminator 117, switch 127, and/or register 135 corresponding to a specific antenna 101 could be combined into one integrated circuit. The foregoing examples are given for purposes of illustration only, and are not to be interpreted as limiting the scope of the invention.

Figure 2A:
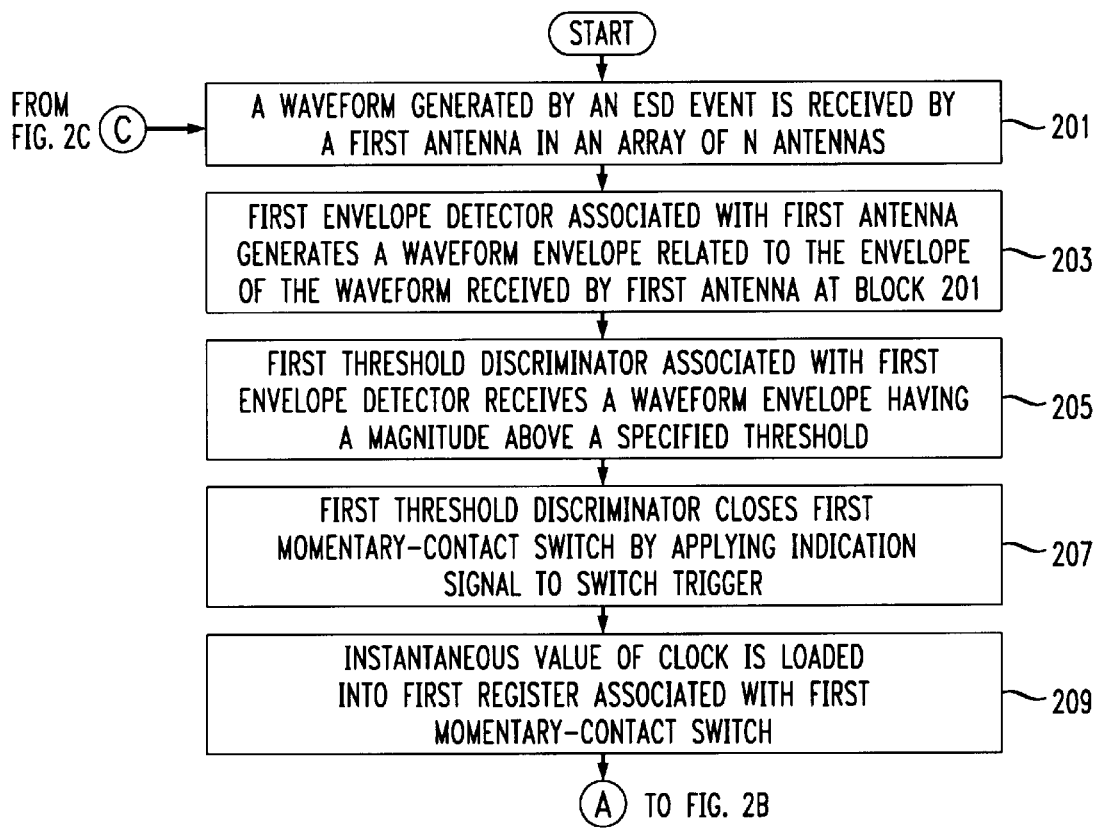
FIGS. 2A–2C together comprise a flowchart setting forth an illustrative method by which the microprocessor of FIG. 1 determines the location of an ESD event.
Figure 2B:
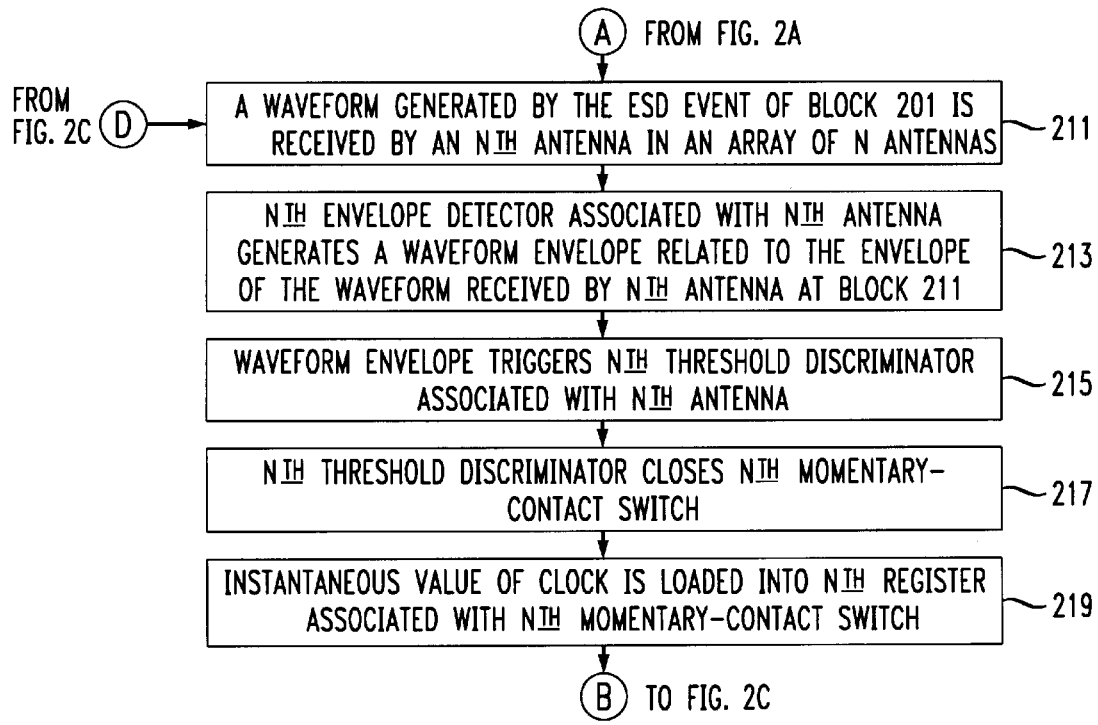
Figure 2C:
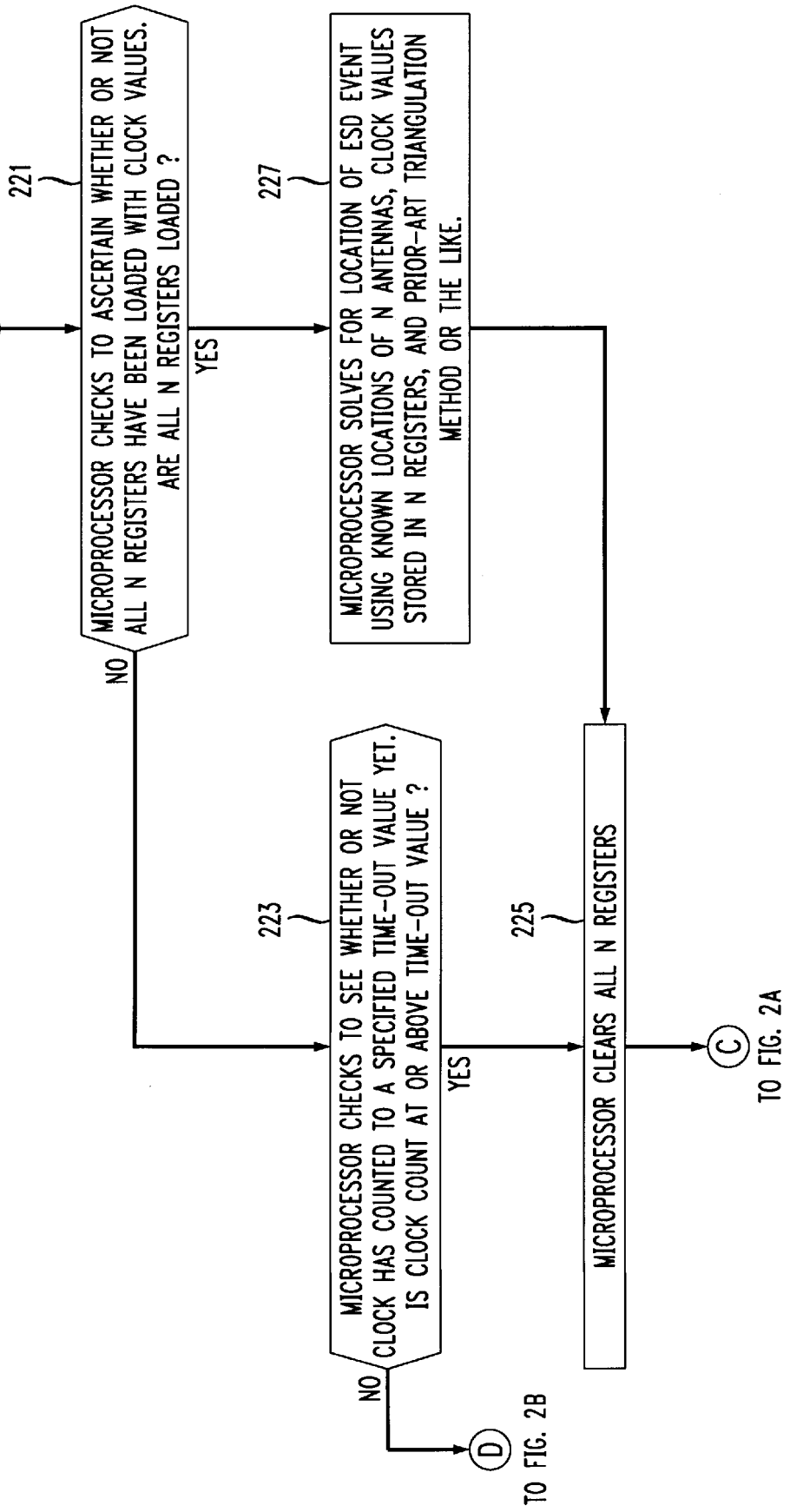

FIGS. 2A–2C together comprise a flowchart setting forth an illustrative method by which the microprocessor 143 of FIG. 1 determines the location of an ESD event. In the example of FIGS. 2A–2C, it is assumed that the threshold discussed above in connection with FIG. 1 is defined with reference to a waveform exceeding a specified value, and, for the digital embodiment, it is assumed that the analog input waveforms are digitized to a value related to the waveform's analog voltage. Of course, as previously discussed, it is also possible to define this threshold in other ways, but the flowchart of FIGS. 2A–2C is intended to provide an illustrative example.

The program begins at block 201 where a waveform having an instantaneous value above a threshold is received by a first antenna in an array of N antennas. A first envelope detector associated with the first antenna generates an envelope waveform related to the envelope of the waveform received by the first antenna (block 203). The envelope waveform is fed to the threshold discriminator, and the threshold discriminator determines that the envelope waveform is above a specified threshold value (block 205). The first threshold discriminator closes a first momentary-contact switch (block 207), and the instantaneous count value of a clock is loaded into a first register associated with the first momentary-contact switch.

Program control progresses to FIG. 2B, where a waveform having an instantaneous value above a threshold is received by an $N^{th}$ antenna in the array of N antennas. Depending on the location of an ESD event relative to the antennas in an antenna array, one of the antennas will receive electromagnetic signals generated by the ESD event before the other antennas receive any signals from this ESD event. In the example of FIGS. 2A–2C, the antenna of block 201 is the first antenna to receive electromagnetic signals from an ESD event, and the other antennas receive signals from this ESD event at slightly later moments in time, as described in block 211.

An Nth envelope detector associated with the Nth antenna generates an envelope waveform. (block 213). The envelope waveform triggers an Nth threshold discriminator associated with the Nth envelope detector (block 215), and the Nth threshold detector closes an Nth momentary contact switch (block 217). The instantaneous count value of a clock is loaded into an Nth register associated with the Nth momentary contact switch.

The program advances to block 221 of FIG. 2C where the microprocessor performs a test to ascertain whether or not all N registers have been loaded with clock count values. If not, the program advances to block 223 and, if so, the program advances to block 227. Following the affirmative branch, leading to block 227, the microprocessor solves for the location of an ESD event using the known locations of the N antennas relative to each other, the clock count values stored in N registers, and a prior-art triangulation method or the like. The microprocessor clears all N registers (block 225), and the program loops back to block 201 (FIG. 2A).

The negative branch from block 221 leads to block 223 where the microprocessor checks to see whether or not the clock has counted to a specified time-out value yet. To this end, note that electromagnetic energy from a single ESD event will normally be received by each antenna in the antenna array within a relatively short period of time. If, for whatever reason, not all of the antennas receive sufficient electromagnetic energy from a given ESD event, then the system should either proceed to provide best estimate of the ESD location or be re-set once a certain amount of time has elapsed, so that the registers will include time delay values representing the same ESD event, and not two different ESD events that occur in succession. The time-out value of block 223 is selected based upon the dimensions of the antenna array that is employed, and, perhaps, also on the maximum expected frequency with which ESD events occur, the maximum expected duration of an ESD event and/or the maximum count the clock can produce.

The affirmative branch from block 221 leads to block 227 where the microprocessor solves for the location of the ESD event using the known locations of the N antennas relative to each other, the clock count values stored in the N registers, and a prior-art triangulation method or the like. The microprocessor clears all N registers (block 225), and the program loops back to block 201 (FIG. 2A).

Any of various triangulation methods may be performed by the microprocessor at block 227. One illustrative example of a suitable triangulation method is disclosed in a paper entitled, "he GPS Equations and the Problem of Apollonius", published in the IEEE Transactions on Aerospace and Electronic Systems, Vol. 32, No. 3, July 1996, by Joseph Hoshen. The triangulation method employed in the context of the present invention may be roughly conceptualized as the inverse of the popular Global Positioning System. More specifically, each satellite transmitter of the GPS system is somewhat analogous to one of the receiving antennae described above in connection with FIG. 1. In the GPS system, the arrival times of a plurality of electromagnetic waves at an unknown location are compared with known locations of the satellites to determine the coordinates of the unknown location. By contrast, the ESD event locating system measures the arrival time of an electromagnetic waveform generated by a single ESD event at a plurality of antennas, and uses the known locations of each antenna to determine the location of the ESD event.

Another illustrative example of a triangulation method suitable for use with the present invention employs a mathematical algorithm known to those skilled in the art as Newton's Method. Newton's Method is described in a number of college-level mathematics texts known to those skilled in the art. This alternative triangulation method begins by identifying the antenna which first receives the electromagnetic signal from the ESD event as Antenna #1. The differences in time between the arrival of the electromagnetic signal at the remaining antennas and Antenna #1 are computed and multiplied by the speed of light to give physical distances associated with each of the time differences. A circle of radius equal to the speed of light multiplied by each respective time difference is inscribed around each of the respective, remaining antennas. Finally, a circle is constructed which both tangent to each of the inscribed circles and passes through the location of Antenna #1. The center of this tangent circle is located at the origin of the ESD event. In practice, the inscription of circles around Antenna #2 through Antenna #n and the construction of the tangent circle would be accomplished by a software program running on a microprocessor. These circles can be mathematically described by a plurality of coupled, nonlinear algebraic equations. Newton's Method is a very convenient algorithm which can be used to compute the solution to this set of equations, thereby determining the location of the ESD source.

Figure 3A:
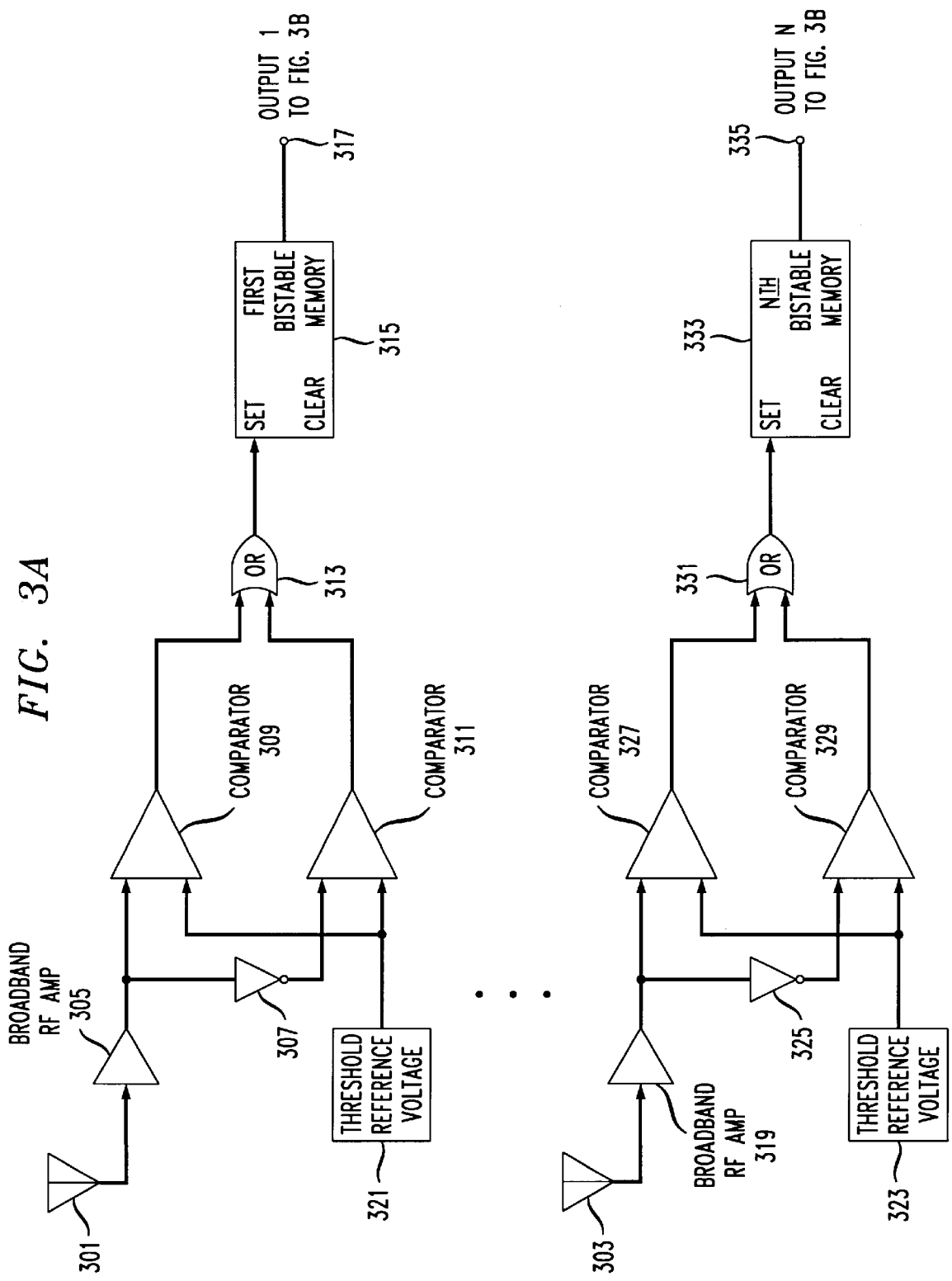
FIGS. 3A–3B together comprise a hardware block diagram of an ESD event locator constructed according to a digital embodiment disclosed herein.
Figure 3B:
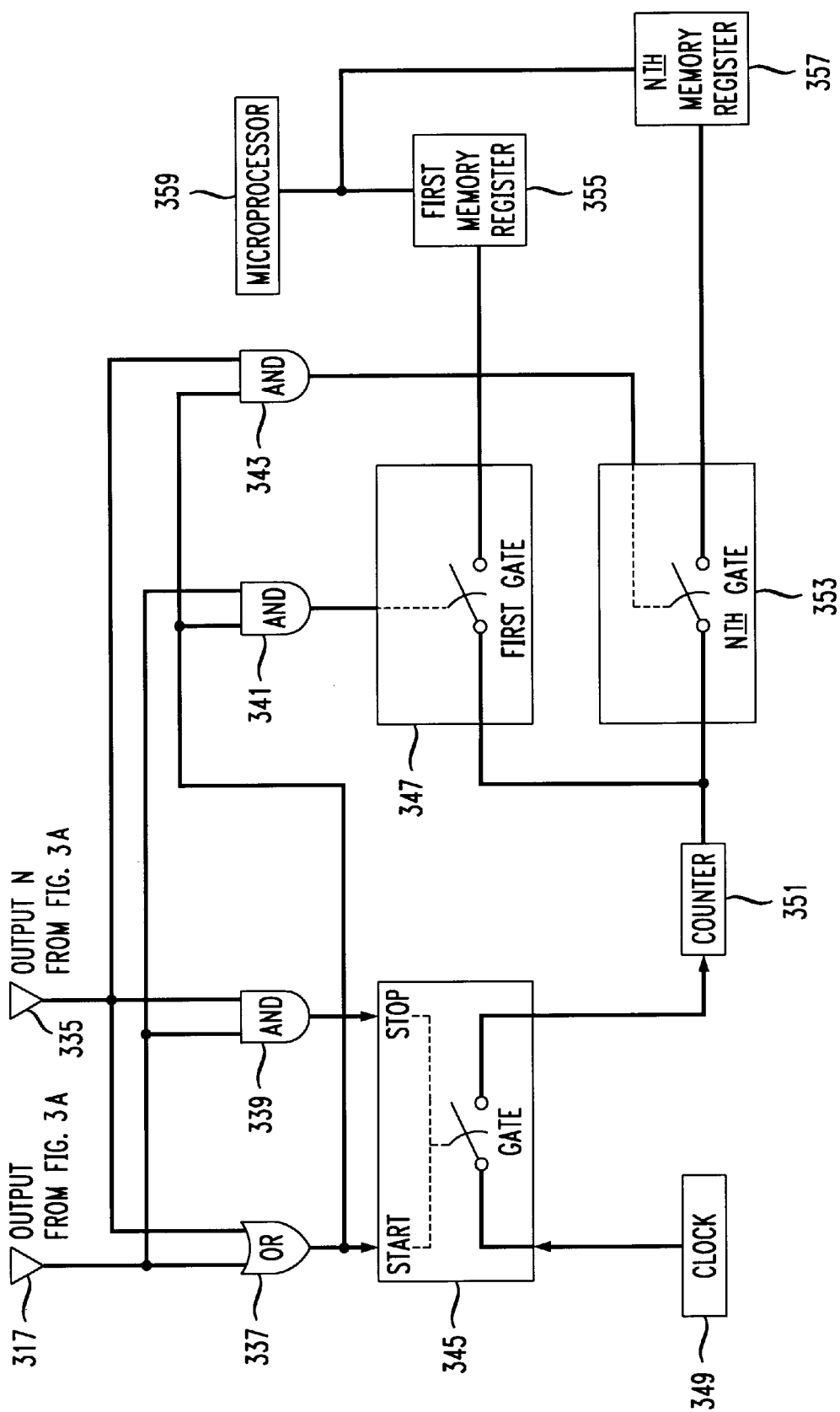

Refer now to FIGS. 3A and 3B, which together comprise a hardware block diagram of an electrostatic discharge (ESD) event locator constructed in accordance with a digital embodiment disclosed herein. A plurality of N antennas 301, 303 are employed. For the sake of simplicity, only two antennas are shown, it being understood that any convenient number of antennas may be employed, so long as at least two antennas are used. However, in the case where only two antennas are used, there is not a unique solution for the location of an ESD event, because the use of two antennas will only determine the ESD source to be one of an infinite number of points lying on a hyperboloid of revolution whose axis of symmetry contains the line segment joining the two antennas.

For most system applications, three or more antennas are used, thereby permitting the location of the ESD event to be substantially uniquely determined. In general, as the number of antennas increases beyond three, the location of an ESD event may be determined with greater precision, and/or the overall coverage area of the ESD event location determination system is increased. Irrespective of the number of antennas that are used, the antennas are positioned at known locations relative to the work area. In this manner, the antennas may be conceptualized as being placed in an array. The antennas may be positioned at various locations within, or near, the work area. Moreover, the antenna array could, but need not, be mounted on a portable structure that maintains the spatial relations between the antennas, such that the portable structure can be moved and transported to various factories and/or assembly lines.

Although virtually any convenient design may be employed to implement antennas 301, 303, in many cases, a convenient design consists of a short whip antenna several inches long mounted on an optional ground plane or used with optional radials. For some system applications, especially where the distance between the antennas 301, 303 and the remainder of the components of the ESD event locator is relatively great, one or more antennas could be incorporated into one or more optional antenna assemblies. The antenna assemblies could include optional broadband RF amplifier circuitry situated in relatively close proximity to the antenna. The assemblies may also include optional receivers and/or demodulators for converting signals to a lower frequency range, for demodulating received signals, and/or for converting received signals down to baseband, as long as information on signal arrival times is accurately preserved.

Pursuant to the embodiment shown in FIGS. 3A and 3B, hereinafter referred to as the digital embodiment, each antenna 301, 303 is coupled to an input of a corresponding broadband RF amplifier 305, 319, respectively. An illustrative RF amplifier would have a relatively wide bandwidth of, for example, 1 GHz, and be designed to amplify relatively low-level RF signals. An output of each respective RF amplifier 305, 319 is fed to a first input of a corresponding first comparator 309, 327, respectively, and also to the input of a corresponding inverter 307, 325, respectively. The output of each respective inverter 307, 325 is fed to a first input of a corresponding second comparator 311, 329, respectively. Second inputs of first and second comparators 309, 311 are coupled to a threshold reference voltage 321, and second inputs of first and second comparators 327, 329 are coupled to threshold voltage reference 323. However, note that the same threshold reference voltage could, but need not, be used to implement threshold reference voltage 321 and threshold reference voltage 323.

The output of first comparator 309 is fed to a first input of OR gate 313, and the output of second comparator 311 is fed to a second input of OR gate 313. The output of first comparator 327 is fed to a first input of OR gate 331, and the output of second comparator 329 is fed to a second input of OR gate 331. The output of OR gate 313 is coupled to a SET input of a first bistable memory 315, and the output of OR gate 331 is coupled to a SET input of an Nth bistable memory 333. The output of first bistable memory 315 (FIG. 3A), denoted as output 1 317, is coupled to: a first input of OR gate 337 (FIG. 3B), a first input of AND gate 339 (FIG. 3B), and also to a first input of AND gate 341. The output of Nth bistable memory 333, denoted as output N 335, is coupled to: an Nth input of OR gate 337, an Nth input of AND gate 339, and also to a first input of AND gate 343.

The output of OR gate 337 is connected to a START input of a gate 345. When the START input is activated, gate 345 closes, presenting a closed circuit path between a clock 349 and a counter 351, such that the counter 351 starts counting pulses received from the clock 349. The output of AND gate 339 is connected to a STOP input of gate 345. When the STOP input is activated, gate 345 opens, presenting an open circuit between the clock 349 and the counter 351, such that the counter 351 will no longer count pulses from the clock 349.

The output of AND gate 341 is coupled to a trigger input of a first gate 347, and the output of AND gate 343 is coupled to a trigger input of an Nth gate 353. When triggered, first gate 347 loads the current value of counter 351 into a first memory register 355. When triggered, Nth gate 353 loads the current value of counter 351 into an Nth memory register 357. Once all N memory registers have been loaded with values from counter 351, a microprocessor 359 accesses the values stored in the memory registers to determine the location of the ESD event. Each memory register stores a value related to the arrival time of the ESD event at a corresponding antenna 301, 303. The microprocessor applies a triangulation algorithm (described above in connection with the analog embodiment) to calculate a location for the ESD event.

Each pair of first and second comparators in FIG. 3A is used to implement an "absolute value comparator." One example of a comparator pair is first comparator 309 and second comparator 311. Another example of a comparator pair is first comparator 327 and second comparator 329. The output of an "absolute value comparator" using comparators 309 and 311 is output 1 (reference numeral 317). The output of an "absolute value comparator" using comparators 327 and 329 is output N (reference numeral 335). The term "absolute value comparator" as used herein signifies that the comparator generates a high output if the absolute value of the input signal applied to the comparator (i.e., the signal at the output of broadband RF amplifier 305, 319, respectively) is greater than or equal to a specified threshold. Otherwise, the output of the comparator is low.

If a conventional comparator was used at the output of broadband RF amplifier 305, instead of the configuration shown in FIG. 3A, the output of such a single comparator would be high if the signal at the output of the RF amplifier 305 was greater than or equal to a threshold, and low otherwise. Therefore, the single comparator would generate a high output only on positive-going signal peaks from the output of RF amplifier 305 (or, alternatively, only on negative-going signal peaks). It is preferable to generate a high comparator output in response to the magnitude of the signal at the output of RF amplifier 305 exceeding a threshold value, irrespective of the absolute polarity of the signal at the output of RF amplifier 305.

We claim:

1. A system for determining the location of an ESD event comprising:

(a) a plurality of antennas, and (b) a device for measuring and comparing the arrival times of an electromagnetic waveform generated by the ESD event at each of the plurality of antennas to determine a location for the ESD event.

2. The system of claim 1 wherein the device for measuring and comparing comprises a plurality of envelope detectors, and each of respective antennas is coupled to a corresponding envelope detector.

3. The system of claim 1 wherein the device for measuring and comparing comprises a microprocessor.

4. The system of claim 1 wherein the device for measuring and comparing comprises a plurality of envelope detectors coupled to a microprocessor, such that each of respective antennas is coupled to a corresponding envelope detector.

5. The system of claim 1 wherein the device for measuring and comparing comprises an analog-to-digital converter.

6. The system of claim 5 wherein the device for measuring and comparing further comprises a microprocessor coupled to the analog-to-digital converter.

7. The system of claim 2 wherein the device for measuring and comparing further comprises a plurality of threshold discriminators, each of respective threshold discriminators coupled to a corresponding envelope detector for receiving an envelope waveform from the envelope detector, each threshold discriminator generating an indication signal in response to a waveform envelope at least a portion of which has a magnitude above, or equal to or above, a specified threshold.

8. The system of claim 1 wherein the device for measuring and comparing further comprises an analog-to-digital converter and a threshold detector responsive to digitized electromagnetic waveforms having instantaneous values at or above, or above, a specified threshold.

* * * * *